(12) United States Patent
Kadowaki

(10) Patent No.: US 11,417,390 B2
(45) Date of Patent: Aug. 16, 2022

(54) MEMORY DEVICE AND OPERATION METHOD THEREOF

(71) Applicant: Winbond Electronics Corp., Taichung (TW)

(72) Inventor: Takuya Kadowaki, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/923,071

(22) Filed: Jul. 7, 2020

(65) Prior Publication Data

US 2022/0013162 A1 Jan. 13, 2022

(51) Int. Cl.
G11C 11/40 (2006.01)
G11C 11/4091 (2006.01)
G11C 11/4096 (2006.01)
G11C 11/4094 (2006.01)

(52) U.S. Cl.
CPC ...... G11C 11/4091 (2013.01); G11C 11/4094 (2013.01); G11C 11/4096 (2013.01)

(58) Field of Classification Search
CPC ............ G11C 11/4091; G11C 11/4096; G11C 11/4094
See application file for complete search history.

(56) References Cited

U.S. PATENT DOCUMENTS 4,943,944 A 7/1990 Sakui et al.
5,579,267 A 11/1996 Koshikawa
5,603,009 A * 2/1997 Konishi ............... G06F 12/0893
711/104
7,639,550 B2 * 12/2009 Ha ....................... G11C 7/1048
365/189.11
8,644,101 B2 2/2014 Jun et al.
9,159,398 B2 10/2015 Mok et al.
(Continued)

FOREIGN PATENT DOCUMENTS

CN 101572118 11/2009
JP H0896573 4/1996
(Continued)

OTHER PUBLICATIONS

"Office Action of Taiwan Counterpart Application", dated Mar. 3, 2021, p. 1-p. 6.
(Continued)

Primary Examiner — Ajay Ojha
(74) Attorney, Agent, or Firm — JCIPRNET

(57) ABSTRACT

A memory device and an operation method thereof are provided. The memory device includes an input/output data latch circuit and a bit line sensing amplifier circuit. The input/output data latch circuit is coupled between a main input/output line pair and a local input/output line pair. The local input/output line pair is coupled to a plurality of bit line pairs through the bit line sensing amplifier circuit. The memory device performs a two-stage operation to input or output data of a selected bit line pair among the bit line pairs. The selected bit line pair connects to the local input/output line pair only during one stage operation of the two-stage operation. Further, during the other stage operation of the two-stage operation, the data of the selected bit line pair latched in the input/output data latch circuit is transmitted to the main input/output line pair.

20 Claims, 7 Drawing Sheets

(56) References Cited

U.S. PATENT DOCUMENTS

| | | | |
|---|---|---|---|
| 2010/0182846 A1 | 7/2010 | Kim | |
| 2019/0080737 A1* | 3/2019 | Nguyen | G11C 8/08 |
| 2019/0324854 A1* | 10/2019 | Park | G06F 11/1076 |
| 2020/0005837 A1* | 1/2020 | Katoch | G11C 7/106 |

FOREIGN PATENT DOCUMENTS

| | | |
|---|---|---|
| JP | 2713929 | 2/1998 |
| JP | 2007242162 | 9/2007 |
| KR | 20090037249 | 4/2009 |
| KR | 20170004322 | 1/2017 |
| TW | I602179 | 10/2017 |

OTHER PUBLICATIONS

"Office Action of Japan Counterpart Application", dated Jun. 22, 2021, p. 1-p. 4.

"Office Action of Korea Counterpart Application" with English translation thereof, dated May 31, 2021, p. 1-p. 7.

\* cited by examiner

MEMORY DEVICE AND OPERATION METHOD THEREOF

BACKGROUND

Technical Field

The disclosure relates to a memory device, and more particularly, relates to a memory device providing improved accessing speed and an operation method thereof.

Description of Related Art

The operation speed of dynamic random access memory (DRAM) is limited to its own accessing mechanism. How to improve the accessing speed of DRAM is an important issue, especially for DRAM having an error-correcting code (ECC) circuit. The ECC circuit may improve data reliability but may lead to an increase in column-to-column delay (tCCD) of DRAM. Therefore, how to provide a memory device exhibiting high reliability and high speed is an important issue in the development of memory technology at present.

SUMMARY

The disclosure provides a memory device and an operation method thereof in which a pipeline structure is included, so that an operation cycle of the memory device is reduced.

An embodiment of the disclosure provides a memory device including an input/output data latch circuit and a bit line sensing amplifier circuit. The input/output data latch circuit is coupled between a main input/output line pair and a local input/output line pair. The local input/output line pair is coupled to a plurality of bit line pairs through the bit line sensing amplifier circuit. When the memory device performs a read operation or a write operation, the memory device performs a two-stage operation to input or output data of a selected bit line pair among the bit line pairs. The selected bit line pair connects to the local input/output line pair only during one stage operation of the two-stage operation. Further, during the other stage operation of the two-stage operation, the data of the selected bit line pair latched in the input/output data latch circuit is transmitted to the main input/output line pair.

An embodiment of the disclosure provides an operation method of a memory device, and the method includes the following steps. During a first-stage operation, data of a selected bit line pair stored in a sensing amplification data latch is latched to an input/output data latch circuit. During a second-stage operation, the data of the selected bit line pair latched in the input/output data latch circuit is transmitted to a main input/output line pair to perform a read operation.

To sum up, in the memory device and the operation method thereof provided by the disclosure, the input/output data latch circuit is arranged between the main input/output line pair and the local input/output line pair, so that the data to be written or read is latched. The target data is temporarily stored between the main input/output line pair and the local input/output line pair, so that accessing is divided into the first-stage operation and the second-stage operation, and the accessing operation is therefore provided with the pipeline structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
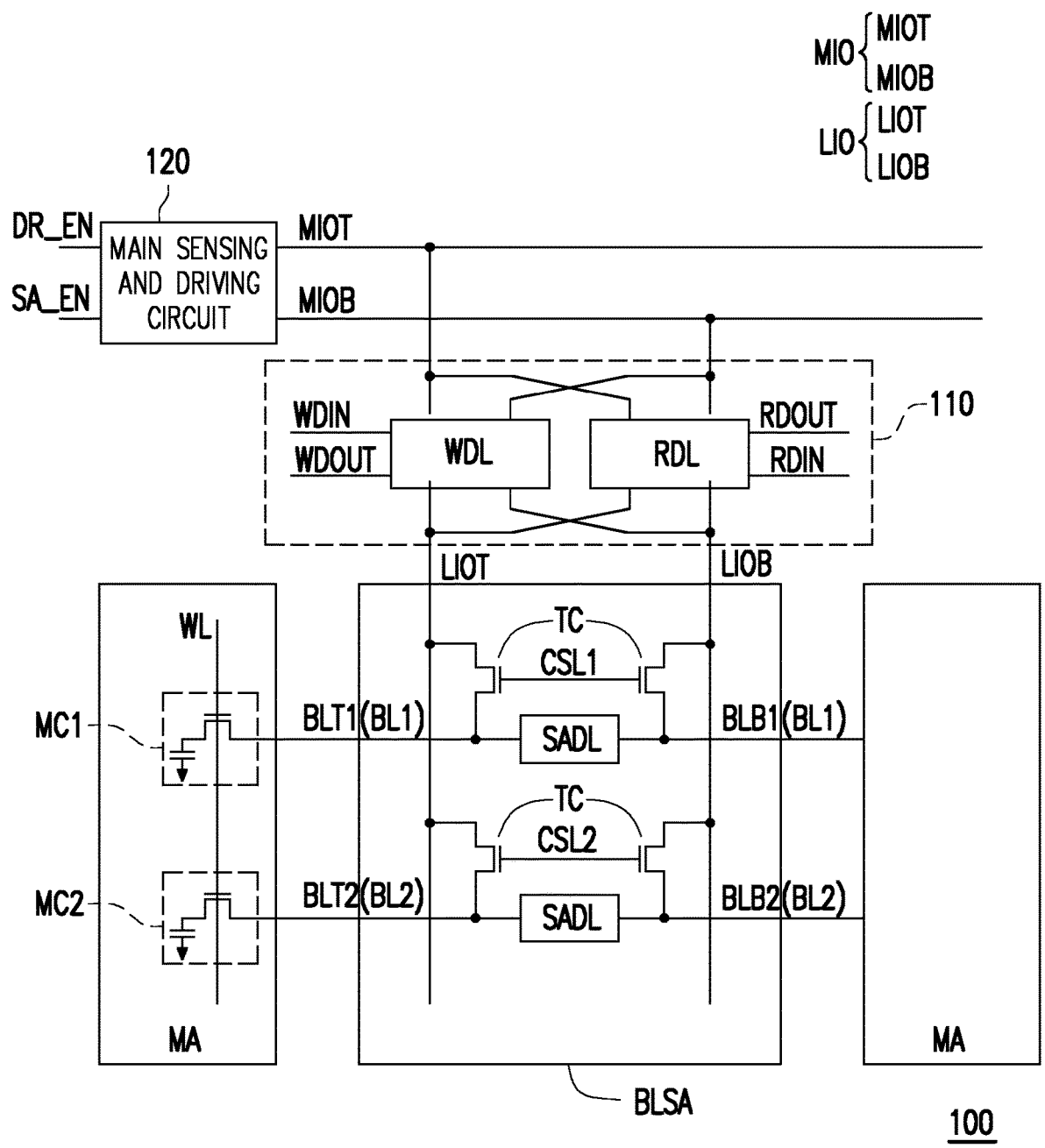
FIG. 1 is a schematic diagram of circuits of a memory device according to an embodiment of the disclosure.

In order to make the disclosure more comprehensible, several embodiments are described below as examples of implementation of the disclosure. Moreover, elements/components/steps with the same reference numerals are used to represent the same or similar parts in the drawings and embodiments.

In the following embodiments, a dynamic random access memory (DRAM) is implemented as an example to illustrate a memory device and an operation method thereof provided by the disclosure. Nevertheless, types of the memory device are not limited by the disclosure.

FIG. 1 is a schematic diagram of circuits of a memory device according to an embodiment of the disclosure. With reference to FIG. 1, a memory device 100 at least includes an input/output data latch circuit 110, a bit line sensing amplifier circuit BLSA, and a memory cell array MA. The memory cell array MA is formed by a plurality of memory cells arranged into an array. These memory cells are connected to a plurality of word lines and a plurality of bit line pairs. For ease of description, only 2 memory cells MC1 and MC2 on the word line WL of the memory cell array MA in FIG. 1 are shown as an example. The memory cell MC1 is coupled to a bit line pair BL1. The bit line pair BL1 includes a bit line BLT1 and a complementary bit line BLB1. The memory cell MC2 is coupled to a bit line pair BL2. The bit line pair BL2 includes a bit line BLT2 and a complementary bit line BLB2.

The input/output data latch circuit 110 is coupled between a main input/output line pair MIO and a local input/output line pair LIO. The main input/output line pair MIO includes a main input/output line MIOT and a complementary main input/output line MIOB. The local input/output line pair LIO includes a local input/output line LIOT and a complementary local input/output line LIOB. The input/output data latch circuit 110 is configured to latch data to be written into the memory cell array MA or to latch data of the memory cell array MA outputted from the local input/output line pair LIO.

The local input/output line pair LIO is coupled to a plurality of bit line pairs such as the bit line pairs BL1 and BL2 through the bit line sensing amplifier circuit BLSA. A column selection signal CSLn controls a switch TC to turn on the local input/output line pair LIO and a bit line pair BLn, where n is an integer. The bit line sensing amplifier circuit BLSA is configured to sense and amplify a potential signal on a bit line pair. The bit line sensing amplifier circuit BLSA further includes a plurality of sensing amplification data latches SADL. The sensing amplification data latches SADL are connected between these bit line pairs and are configured to store data of these bit line pairs.

A main sensing and driving circuit 120 is coupled to the main input/output line pair MIO and is controlled by a driving-enabled signal DR_EN and a sensing-enabled signal SA_EN. When the driving-enabled signal DR_EN enables the main sensing and driving circuit 120, the memory device 100 performs a write operation on the memory cell array MA. The main input/output line pair MIO receives write data from the main sensing and driving circuit 120. The local input/output line pair LIO receives the write data from the main input/output line pair MIO through the input/output data latch circuit 110 and then transmits the write data to the sensing amplification data latch SADL on the corresponding bit line pair. When the sensing-enabled signal SA_EN enables the main sensing and driving circuit 120, the memory device 100 performs a read operation on the memory cell array MA. Read data stored in the sensing amplification data latch SADL is transmitted to the input/output data latch circuit 110 through the local input/output line pair LIO and is latched to the input/output data latch circuit 110. Next, the read data is transmitted to the main input/output line pair MIO by the input/output data latch circuit 110. Finally, the read data of the main input/output line pair MIO is sensed by the main sensing and driving circuit 120.

In short, in this embodiment, when the memory device 100 performs the read operation or the write operation, the memory device 100 performs a two-stage operation to input or output data of a selected bit line pair among the bit line pairs. For instance, the memory cell to be accessed is the memory cell MC1, and thereby, the selected bit line pair is the bit line pair BL1. The selected bit line pair BL1 connects to the local input/output line pair LIO only during one stage operation of the two-stage operation. During the other stage operation of the two-stage operation, data of the selected bit line pair BL1 latched in the input/output data latch circuit 110 is transmitted to the main input/output line pair MIO.

More specifically, the two-stage operation comprises a first-stage operation and a second-stage operation, When the memory device 100 performs the read operation on the memory cell MC1, during the first-stage operation, the data of the selected bit line pair BL1 is latched to the input/output data latch circuit 110 from the corresponding sensing amplification data latch SADL. During the second-stage operation, the data latched in the input/output data latch circuit 110 is transmitted to the main input/output line pair MIO. When the memory device 100 performs the write operation on the memory cell MC1, during the first-stage operation, write data is latched to the input/output data latch circuit 110 from the main input/output line pair MIO. During the second-stage operation, the write data latched in the input/output data latch circuit 110 is transmitted to the sensing amplification data latch SADL corresponding to the selected bit line pair BL1.

Implementation details are further illustrated below.

Figure 2A:
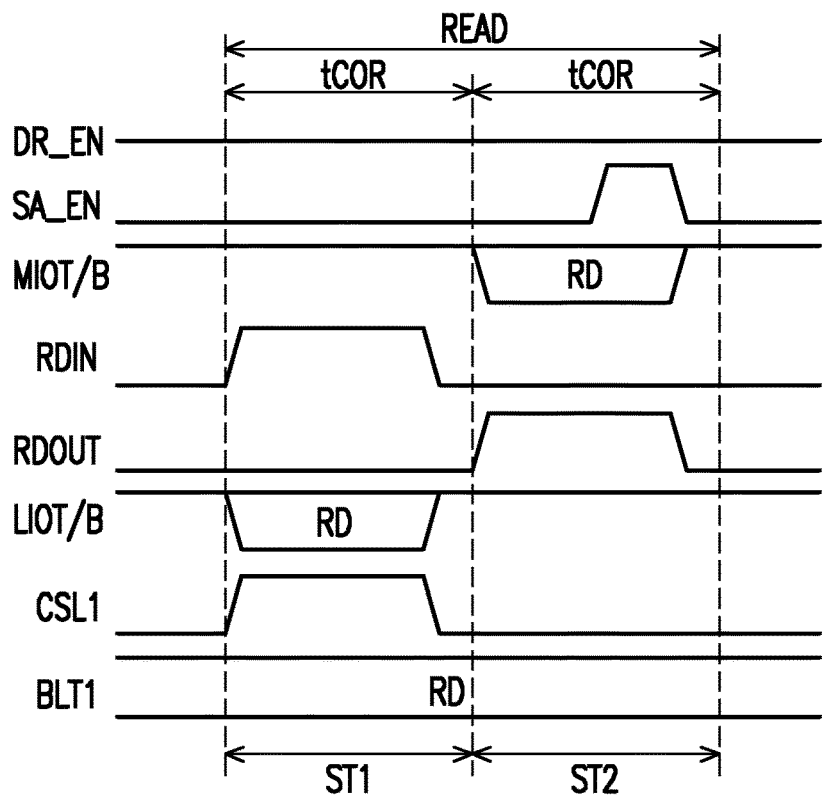
FIG. 2A is a time sequence diagram of a read operation according to an embodiment of the disclosure.
Figure 2B:
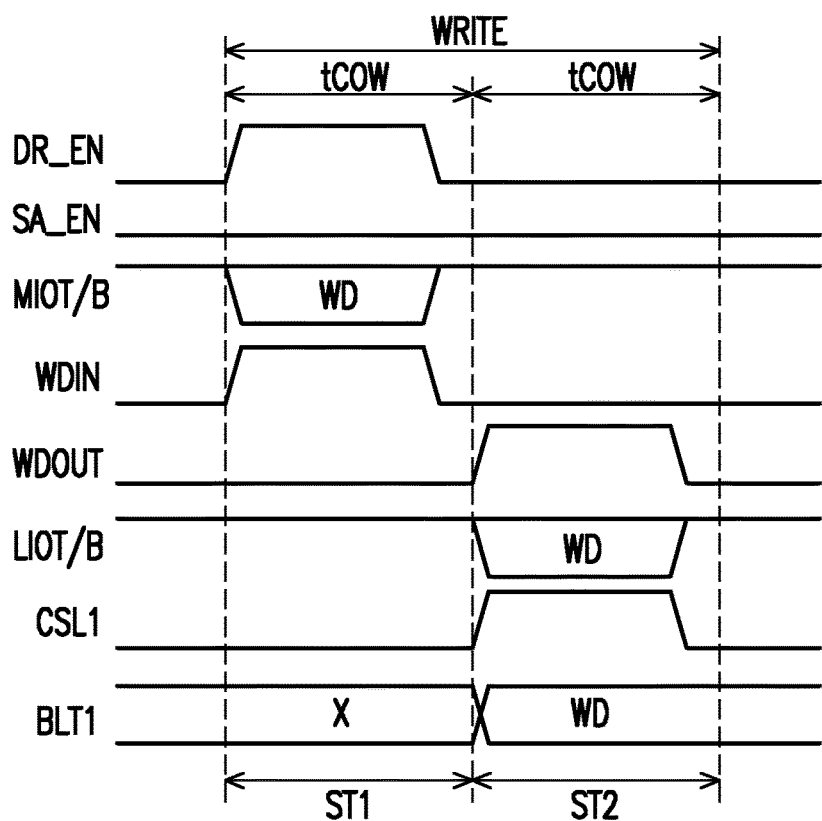
FIG. 2B is a time sequence diagram of a write operation according to an embodiment of the disclosure.

FIG. 2A is a time sequence diagram of a read operation according to an embodiment of the disclosure. FIG. 2B is a time sequence diagram of a write operation according to an embodiment of the disclosure. With reference to FIG. 1 and FIG. 2B together, in this embodiment, the input/output data latch circuit 110 includes a read data latch circuit RDL and a write data latch circuit WDL. The read data latch circuit RDL is coupled between the main input/output line pair MIO and the local input/output line pair LIO and is controlled by a read input signal RDIN and a read output signal RDOUT. The write data latch circuit WDL is coupled between the main input/output line pair MIO and the local input/output line pair LIO and is controlled by a write input signal WDIN and a write output signal WDOUT.

With reference to FIG. 2A, when the memory device 100 performs a read operation READ, each read operation READ is divided into two stages: a first-stage operation ST1 and a second-stage operation ST2. During the first-stage operation ST1, a column selection signal CSL1 chooses to connect the bit line pair BL1 and the local input/output line pair LIO. The sensing amplification data latch SADL located between the bit line BLT1 and the complementary bit line BLB1 transmits read data RD to the local input/output line pair LIO. In addition, the read input signal RDIN sets the read data latch circuit RDL to receive and latch the read data RD from the local input/output line pair LIO. During the second-stage operation ST2, the read output signal RDOUT sets the read data RD latched in the read data latch circuit RDL to be transmitted to the main input/output line pair MIO. Further, the sensing-enabled signal SA_EN sets the main sensing and driving circuit 120 to sense the read data RD on the main input/output line pair MIO.

Note that during the second-stage operation ST2 of the read operation READ, the column selection signal CSL1 is in a disabled state, and the bit line pair BL1 disconnects the local input/output line pair LIO. In the read operation READ in this embodiment, a length of time of the first-stage operation ST1 and a length of time of the second-stage operation ST2 are equal and are both tCOR, and the length of time tCOR is equal to a column selection cycle of the memory device 100. The column selection cycle is a pulse cycle in which each column is activated.

With reference to FIG. 2B, when the memory device 100 performs a write operation WRITE, each write operation WRITE is divided into two stages as well: the first-stage operation ST1 and the second-stage operation ST2. During the first-stage operation ST1, the driving-enabled signal DR_EN is in an enabled state, and the main sensing and driving circuit 120 transmits write data WD to the main input/output line pair MIO. The write input signal WDIN sets the write data latch circuit WDL to receive and latch the write data WD from the main input/output line pair MIO. During the second-stage operation ST2, the write output signal WDOUT sets the write data latch circuit WDL to output the latched write data WD to the local input/output line pair LIO. Besides, the column selection signal CSL1 sets the bit line pair BL1 to connect to the local input/output line pair LIO. The write data WD is transmitted to the sensing amplification data latch SADL corresponding to the bit line pair BL1. Finally, the write data WD is written into the memory cell MC1.

Note that during the first-stage operation ST1 of the write operation WRITE, the column selection signal CSL1 is in the disabled state, and the bit line pair BL1 is not yet connected to the local input/output line pair LIO. In the read operation WRITE in this embodiment, the length of time of the first-stage operation ST1 and the length of time of the second-stage operation ST2 are equal and are both tCOW, and the length of time tCOW is equal to the column selection cycle of the memory device 100.

In this embodiment, whether it is the two-stage operation of the write operation WRITE or the two-stage operation of the read operation READ, the lengths of time of the stage operations are the same. The lengths of time of the first-stage operation ST1 and the second-stage operation ST2 of the read operation READ are both tCOR. The lengths of time of the first-stage operation ST1 and the second-stage operation ST2 of the write operation WRITE are both tCOW. In addition, the lengths of time of the two-stage operations in the write operation WRITE and in the read operation READ are equal. The length of time tCOR of the read operation READ and the length of time tCOW of the write operation WRITE are equal. Herein, the length of time of each stage operation of is one column selection cycle.

Given that the write data WD and the read data RD are latched through the input/output data latch circuit 110, the two-stage operation may be adopted to by the memory device 100 to perform both the write operation WRITE and the read operation READ. As such, the memory device 100 has a pipeline structure and may execute multiple instructions in parallel.

Figure 3:
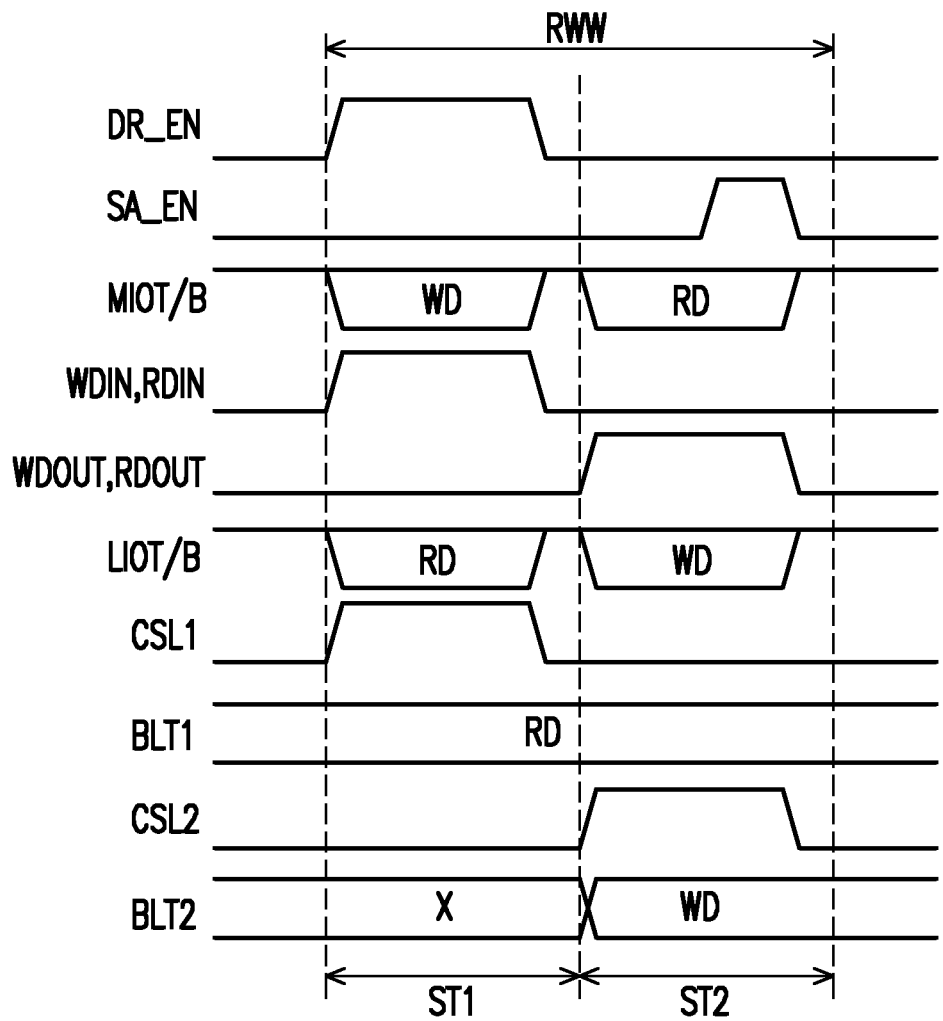
FIG. 3 is a time sequence diagram of a read-while-write operation according to an embodiment of the disclosure.

FIG. 3 is a time sequence diagram of a read-while-write operation according to an embodiment of the disclosure. With reference to FIG. 3, when the memory device 100 performs a read-while-write operation RWW, each read-while-write operation RWW is divided into two stages: the first-stage operation ST1 and the second-stage operation ST2. During the first-stage operation ST1, the driving-enabled signal DR_EN is in the enabled state, and the main sensing and driving circuit 120 transmits the write data WD to the main input/output line pair MIO. The write input signal WDIN enables the write data latch circuit WDL to receive the write data WD from the main input/output line pair MIO and to latch the write data WD. At the same time, the read input signal RDIN enables the read data latch circuit RDL to receive and latch the read data RD from the local input/output line pair LIO. During the first-stage operation ST1, the column selection signal CSL1 chooses the bit line pair BL1 to connect to the local input/output line pair LIO. The read data RD is transmitted to the read data latch circuit RDL from the sensing amplification data latch SADL of the bit line pair BL1.

In short, during the first-stage operation ST1, the memory device 100 may input the write data WD to the write data latch circuit WDL and input the read data RD of the memory cell MC1 to the read data latch circuit RDL in parallel.

During the second-stage operation ST2, the write output signal WDOUT controls the write data latch circuit WDL to output the latched write data WD to the local input/output line pair LIO. At the same time, the read output signal RDOUT controls the read data latch circuit RDL to output the read data RD to the main input/output line pair MIO, so that the main sensing and driving circuit 120 may sense the read data RD from the memory cell MC1. Besides, a column selection signal CSL2 chooses the bit line pair BL2 to connect to the local input/output line pair LIO. The write data WD is transmitted to the sensing amplification data latch SADL corresponding to the bit line pair BL2. The write data WD is written into the memory cell MC2.

In short, during the second-stage operation ST2, the memory device 100 may output the read data WD from the write data latch circuit WDL and output the read data RD of the memory cell MC1 from the read data latch circuit RDL in parallel. During the second-stage operation ST2, the memory device 100 may sense the read data of the memory cell MC1 and write the write data WD to the memory cell MC2 at the same time.

In this embodiment, a length of time of the first-stage operation ST1 and a length of time of the second-stage operation ST2 of the read-while-write operation RWW are equal and may be one column selection cycle. For instance, a length of time of the read-while-write operation RWW may be equal to 2 times the length of time tCOR (2*tCOR) or 2 times the length of time tCOW (2*tCOW).

Figure 4:
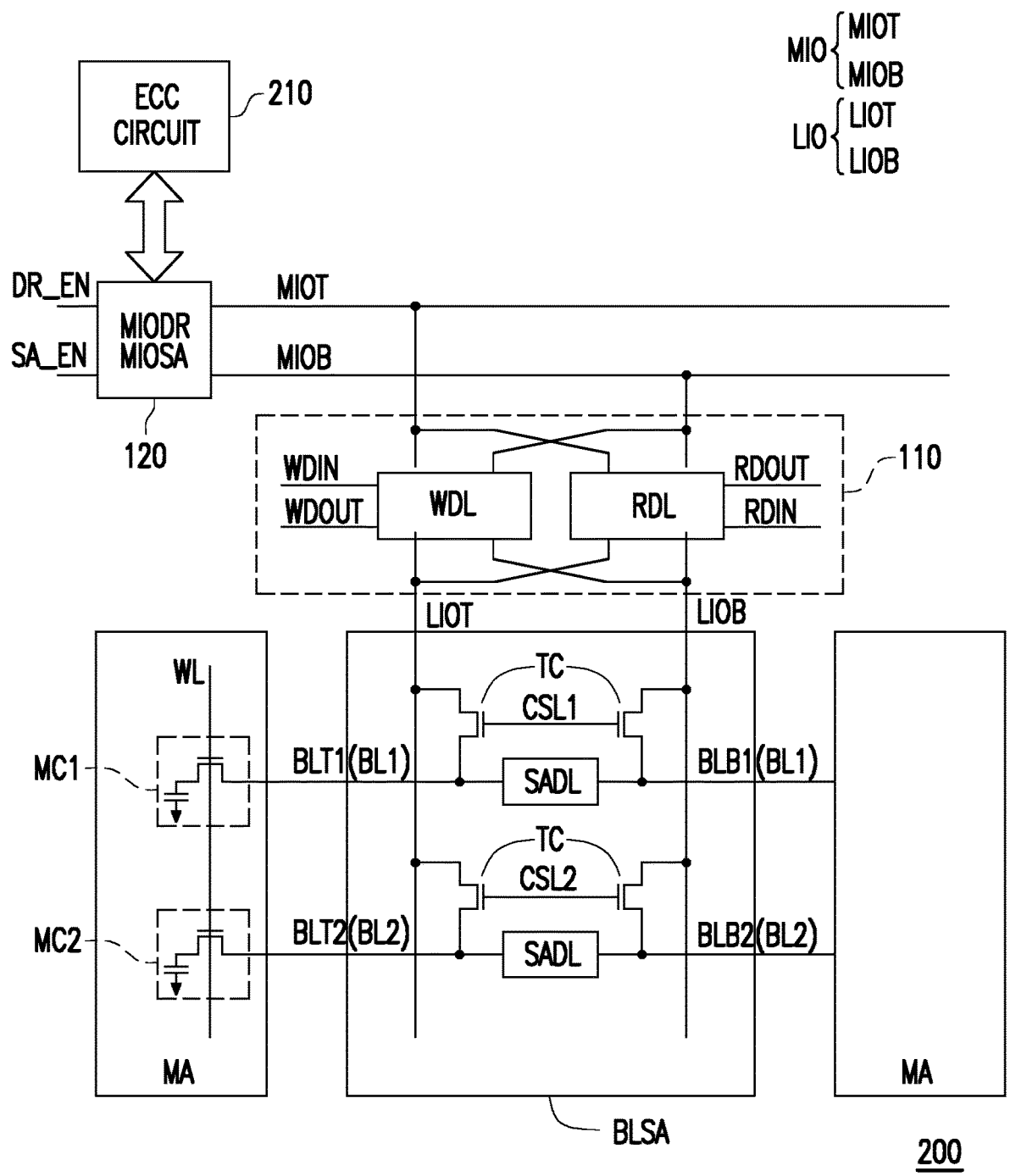
FIG. 4 is a schematic diagram of circuits of a memory device according to another embodiment of the disclosure.

FIG. 4 is a schematic diagram of circuits of a memory device according to another embodiment of the disclosure. With reference to FIG. 4, a memory device 200 is similar to the memory device 100 and may be used to implement the foregoing embodiments. A difference between the memory device 200 and the memory device 100 lies in that the memory device 200 further includes an error-correcting code (ECC) circuit 210. The ECC circuit 210 is configured to perform error checking and correction on the data of the selected bit line pair.

Figure 5:
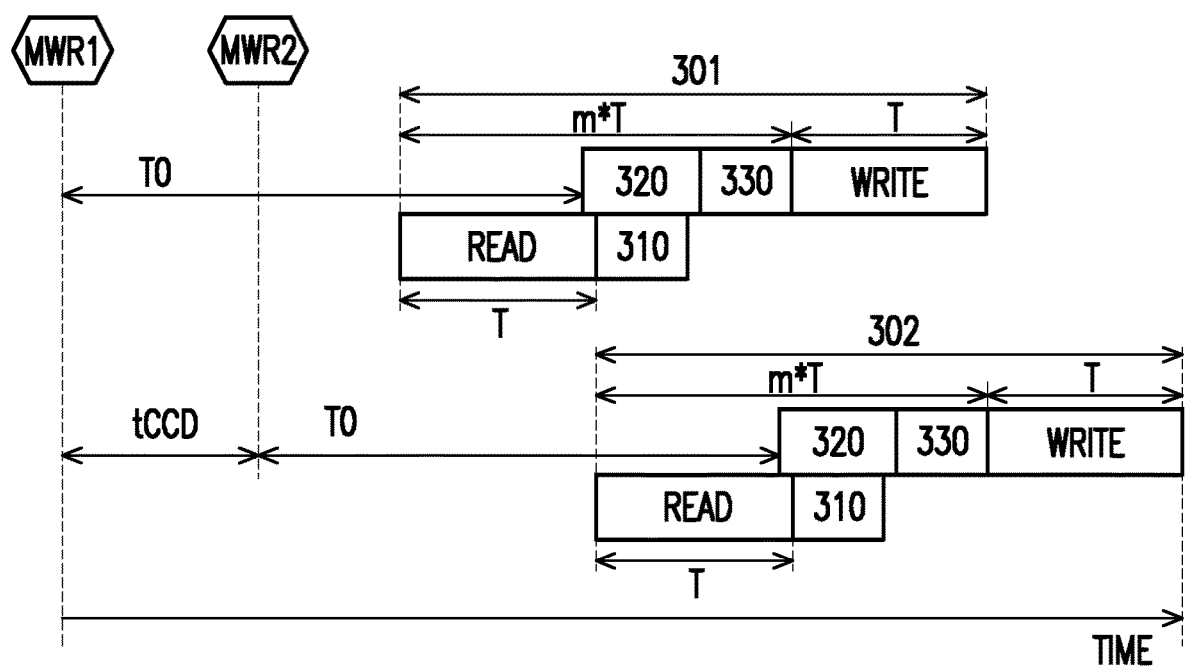
FIG. 5 is a time sequence diagram of a masked-write operation according to an embodiment of the disclosure.

FIG. 5 is a time sequence diagram of a masked-write operation according to an embodiment of the disclosure. With reference to FIG. 4 and FIG. 5 together, the memory device 200 may be used to implement the embodiment of FIG. 5. The memory device 200 successively receives a first masked-write command MWR1 and a second masked-write command MWR2 and correspondingly performs a read-modify-write operation 301 and a read-modify-write operation 302. In a process in which the read-modify-write operation 301 or 302 is performed, after the read operation READ is performed, the ECC circuit 210 performs an error checking and correction step 310 on the read data. In addition, before the write operation WRITE is performed, the memory device 200 is required to perform a data transmission step 320 and a parity data generation step 330. Descriptions of the foregoing embodiments may be referenced for the implementation details of the read operation READ and the write operation WRITE. Not until time T0 later starting from receiving the masked-write command (MWR1 or MWR2) does the memory device 200 start performing the data transmission step 320 and the parity data generation step 330. In the parity data generation step 330, the write data and the read data are combined, for example, to generate parity data.

In this embodiment, a cycle length of the read operation READ and a cycle length of the write operation WRITE are equal and are both a length of time T. In the case that the length of time T is equal to two column selection cycles, for example, 2*tCOR or 2*tCOW, the length of time of each stage operation of the two-stage operation may be equal to one column selection cycle for both the read operation READ and the write operation WRITE. When the memory device 200 performs the read-modify-write operation 301 or 302 on a selected bit line, starting time applied to the read operation READ of the selected bit line pair is at least 2 times the length of time T earlier than starting time applied to the write operation WRITE of the selected bit line pair. That is, not until at least 4 column selection cycles later does the memory device 200 begins performing the write operation WRITE after the read operation READ is started. In other words, in the read-modify-write operation provided by this embodiment, a starting time point of the read operation READ is m*T earlier than a starting time point of the write operation WRITE, where m is an integer greater than or equal to 2.

Note that a time interval tCCD between the first masked-write command MWR1 and the second masked-write command MWR2 may be reduced to n*T, where n is an integer greater than or equal to 1. That is, a minimum column-to-column delay provided by this embodiment may be reduced to at least two column selection cycles, and an operation speed of the memory device 200 may thereby increase.

Figure 6:
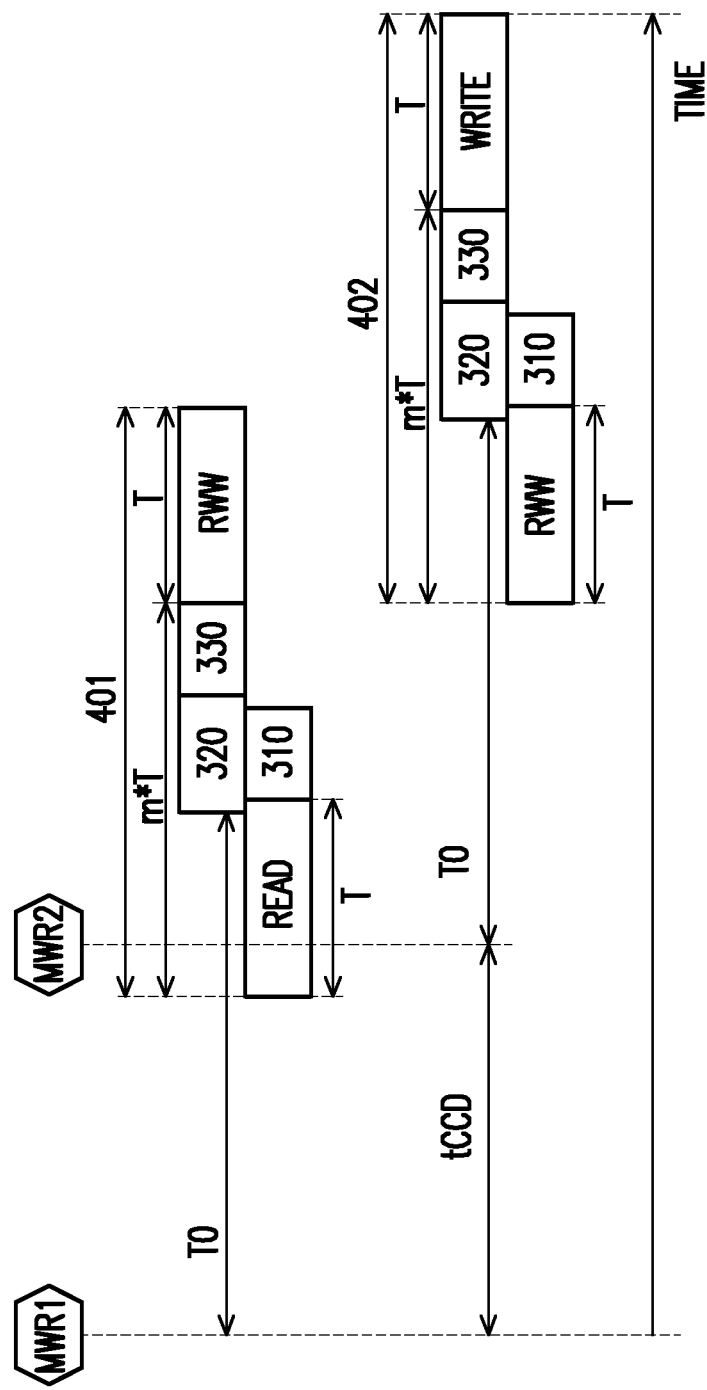
FIG. 6 is a time sequence diagram of a masked-write operation according to an embodiment of the disclosure.

FIG. 6 is a time sequence diagram of a masked-write operation according to an embodiment of the disclosure. With reference to FIG. 4 and FIG. 6 together, the memory device 200 may be used to implement the embodiment of FIG. 6. The memory device 200 successively receives the first masked-write command MWR1 and the second masked-write command MWR2 and correspondingly performs a read-modify-write operation 401 and a read-modify-write operation 402. In a process in which the read-modify-write operation 401 or 402 is performed, after the read operation READ is performed, the ECC circuit 210 performs the error checking and correction step 310 on the read data. Similar to the process flow provided in the embodiment of FIG. 5, the memory device 200 performs the data transmission step 320 and the parity data generation step 330 before data is written back to the memory cell.

In this embodiment, the memory device 200 exhibits a read-while-write function. The memory device 200 may perform the read-while-write operation RWW after step 330. When writing data back to the memory cell in the read-modify-write operation 401, the memory device 200 may read data from the memory cell in the read-modify-write operation 402 at the same time. In this way, an accessing speed of the memory device 200 may increase. The foregoing embodiments may be referenced for the implementation details of the read-while-write operation RWW, the read operation READ, and the write operation WRITE.

In this embodiment, a cycle length of the read-while-write operation RWW, the cycle length of the read operation READ, and the cycle length of the write operation WRITE are equal and are the length of time T. In the case that the length of time T is equal to two column selection cycles, for example, 2*tCOR or 2*tCOW, when the memory device 200 performs the read-modify-write operation 401 or 402 on the selected bit line, the starting time point of the read operation READ is m*T earlier than a starting time point of the read-while-write operation RWW or the starting time point of the write operation WRITE, where m is an integer greater than or equal to 2.

Note that the time interval tCCD between the first masked-write command MWR1 and the second masked-write command MWR2 is reduced to m*T as well. That is, the minimum column-to-column delay provided by this embodiment may be reduced to at least 4 column selection cycles.

Figure 7:
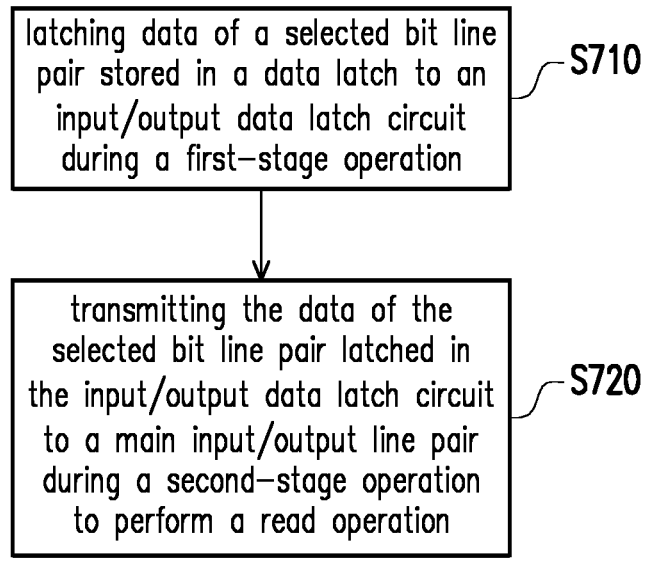
FIG. 7 is a flow chart of an operation method of the memory device according to an embodiment of the disclosure.

FIG. 7 is a flow chart of an operation method of the memory device according to an embodiment of the disclosure. With reference to FIG. 7, the operation method provided by FIG. 7 is suitable for the read operation READ provided by the embodiments of FIG. 1 to FIG. 6. The reference numerals used in the foregoing embodiments are applied as follows to describe the operation method provided by FIG. 7.

In step S710, data of a selected bit line pair stored in the sensing amplification data latch SADL is latched to an input/output data latch circuit 110 during the first-stage operation ST1. In step S720, the data of the selected bit line pair latched in the input/output data latch circuit 110 is transmitted to the main input/output line pair MIO during the second-stage operation ST2 to perform the read operation READ.

Figure 8:
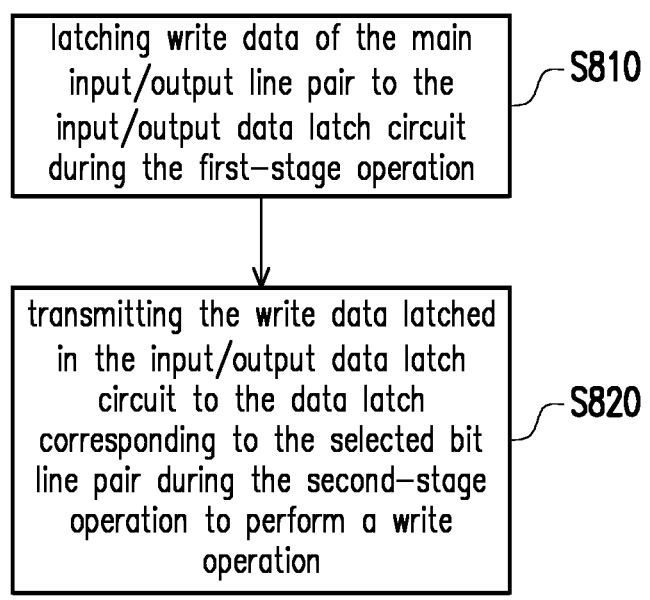
FIG. 8 is a flow chart of an operation method of the memory device according to another embodiment of the disclosure.

FIG. 8 is a flow chart of an operation method of the memory device according to another embodiment of the disclosure. With reference to FIG. 8, the operation method provided by FIG. 7 is suitable for the write operation WRITE provided by the embodiments of FIG. 1 to FIG. 6. The reference numerals used in the foregoing embodiments are applied as follows to describe the operation method provided by FIG. 8.

In step S810, write data of the main input/output line pair MIO is latched to the input/output data latch circuit 110 during the first-stage operation ST1. In step S820, the write data latched in the input/output data latch circuit 110 is transmitted to the sensing amplification data latch SADL corresponding to the selected bit line pair during the second-stage operation ST2 to perform a write operation.

Each step in FIG. 7 and FIG. 8 is described in detail in the embodiments of FIG. 1 to FIG. 6, and a person of ordinary skill in the art may obtain sufficient suggestions and teachings from the foregoing description, and repeated description is thus not provided herein.

In view of the foregoing, in the memory device provided by the disclosure, an accessing operation is divided into two stages through the input/output data latch circuit disposed between the main input/output line pair and the local input/output line pair. That is, data is transmitted from the sensing amplification data latch on the bit line pair to the input/output data latch circuit, and data latched in the input/output data latch circuit is transmitted to the main input/output line pair. In this way, the memory device has a pipeline structure and may execute multiple instructions in parallel. The accessing speed of the memory device is thereby improved The embodiments of the disclosure also provide the operation method suitable for the memory device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
   an input/output data latch circuit, coupled between a main input/output line pair and a local input/output line pair; and
   a bit line sensing amplifier circuit, wherein the local input/output line pair is coupled to a plurality of bit line pairs through the bit line sensing amplifier circuit,
   wherein the memory device performs a two-stage operation to input or output data of a selected bit line pair among the bit line pairs when the memory device performs a read operation or a write operation,
   wherein the selected bit line pair connects to the local input/output line pair only during one stage operation of the two-stage operation, and the data of the selected bit line pair latched in the input/output data latch circuit is transmitted to the main input/output line pair during the other stage operation of the two-stage operation,
   wherein the bit line sensing amplifier circuit comprises a plurality of sensing amplification data latches, configured to store data of the bit line pairs,
   wherein the two-stage operation comprises a first-stage operation and a second-stage operation, wherein when the memory device performs the read operation, the data of the selected bit line pair is latched to the input/output data latch circuit from the corresponding sensing amplification data latch during the first-stage operation, and the data latched in the input/output data latch circuit is transmitted to the main input/output line pair during the second-stage operation, wherein when the memory device performs the write operation, write data is latched to the input/output data latch circuit from the main input/output line pair according to a write input signal inputted to the input/output data latch circuit during the first-stage operation, and the write data latched in the input/output data latch circuit is transmitted to the sensing amplification data latch corresponding to the selected bit line pair according to a write output signal inputted to the input/output data latch circuit during the second-stage operation, wherein the write output signal is different from the write input signal, wherein the selected bit line pair electrically connects to the local input/output line pair only during the second-stage operation of the write operation, wherein a length of time of the first-stage operation of the write operation is equal to a length of time of the second-stage operation of the write operation, and the length of time of the first-stage operation of the write operation is equal to a time length of a the first-stage operation of the read operation.

2. The memory device according to claim 1, wherein the input/output data latch circuit comprises:
   a read data latch circuit, coupled between the main input/output line pair and the local input/output line pair, wherein when the memory device performs the read operation, the read data latch circuit receives the data of the selected bit line pair during the first-stage operation, and the data latched in the read data latch circuit is transmitted to the main input/output line pair during the second-stage operation; and
   a write data latch circuit, coupled between the main input/output line pair and the local input/output line pair, wherein when the memory device performs the write operation, the write data latch circuit receives the write data during the first-stage operation, and the write data latched in the write data latch circuit is transmitted to the sensing amplification data latch corresponding to the selected bit line pair during the second-stage operation.

3. The memory device according to claim 1, wherein when the memory device performs a read-while-write operation, a read-while-write cycle comprises two column selection cycles, and the input/output data latch circuit comprises a read data latch circuit and a write data latch circuit,
   wherein in a first one of the column selection cycles in the read-while-write cycle, the read data latch circuit receives data of a first bit line pair from a first sensing amplification data latch, and the write data latch circuit receives write data from the main input/output line pair, and
   in a second one of the column selection cycles in the read-while-write cycle, the write data latch circuit provides the write data to a second sensing amplification data latch, and the read data latch circuit transmits the data of the first bit line pair to the main input/output line pair,
   wherein the first bit line pair and a second bit line pair are two of the bit line pairs, and the first sensing amplification data latch and the second sensing amplification data latch respectively store the data of the first bit line pair and data of the second bit line pair.

4. The memory device according to claim 3, further comprising:
   an error-correcting code circuit, configured to perform error checking and correction on the data of the selected bit line pair,
   wherein the memory device performs the read-while-write operation in a process of performing a read-modify-write operation, wherein starting time applied to the read operation of the selected bit line pair is at least two read-while-write cycles earlier than starting time applied to the read-while-write operation or the write operation of the selected bit line pair.

5. The memory device according to claim 4, wherein a column-to-column delay is at least one read-while-write cycle and is an integer multiple of the read-while-write cycle.

6. The memory device according to claim 1, further comprising:
   an error-correcting code circuit, configured to perform error checking and correction on the data of the selected bit line pair,
   wherein cycle lengths of the read operation and the write operation are both equal to two column selection cycles, and a length of time of each stage operation of the two-stage operation is equal to one column selection cycle,
   wherein starting time applied to the read operation of the selected bit line pair is at least 4 column selection cycles earlier than starting time applied to the write operation of the selected bit line pair when the memory device performs a read-modify-write operation on the selected bit line pair.

7. The memory device according to claim 6, wherein a column-to-column delay is at least two column selection cycles and is an integer multiple of the at least two column selection cycles.

8. The memory device according to claim 1, wherein lengths of time of stage operations of the two-stage operation are equal.

9. The memory device according to claim 8, wherein the lengths of time of the two-stage operations in the write operation and in the read operation are equal.

10. An operation method of a memory device, comprising:
    when the memory device performs a read operation, latching data of a selected bit line pair stored in a sensing amplification data latch to an input/output data latch circuit during a first-stage operation, and transmitting the data of the selected bit line pair latched in the input/output data latch circuit to a main input/output line pair during a second-stage operation,
    when the memory device performs a write operation, latching write data to the input/output data latch circuit from the main input/output line pair according to a write input signal inputted to the input/output data latch circuit during the first-stage operation, and transmitting the write data latched in the input/output data latch circuit to the sensing amplification data latch corresponding to the selected bit line pair according to a write output signal inputted to the input/output data latch circuit during the second-stage operation, wherein the write output signal is different from the write input signal, wherein the write operation comprises a first-stage operation and a second-stage operation, and the selected bit line pair electrically connects to a local input/output line pair only during the second-stage operation of the write operation, wherein a length of time of the first-stage operation of the write operation is equal to a length of time of the second-stage operation of the write operation, and the length of time of the first-stage operation of the write operation is equal to a time length of a the first-stage operation of the read operation.

11. The operation method according to claim 10, wherein the step of performing the read operation and the write operation further comprises:

when the memory device performs the read operation, receiving the data of the selected bit line pair by a read data latch circuit in the input/output data latch circuit during the first-stage operation and transmitting the data latched in the read data latch circuit to the main input/output line pair during the second-stage operation; and when the memory device performs the write operation, receiving the write data by a write data latch circuit in the input/output data latch circuit during the first-stage operation and transmitting the write data latched in the write data latch circuit to the sensing amplification data latch corresponding to the selected bit line pair during the second-stage operation.

12. The operation method according to claim 11, further comprising:

a read-while-write cycle of a read-while-write operation comprising two column selection cycles;

in a first one of the column selection cycles in the read-while-write cycle, receiving data of a first bit line pair from a first sensing amplification data latch by the read data latch circuit and receiving the write data from the main input/output line pair by the write data latch circuit; and in a second one of the column selection cycles in the read-while-write cycle, providing the write data to a second sensing amplification data latch by the write data latch circuit and transmitting the data of the first bit line pair to the main input/output line pair by the read data latch circuit, wherein the first bit line pair and a second bit line pair are two of the bit line pairs, and the first sensing amplification data latch and the second sensing amplification data latch respectively store the data of the first bit line pair and data of the second bit line pair.

13. The operation method according to claim 12, further comprising:

performing error checking and correction on the data of the selected bit line pair by an error-correcting code circuit, wherein the read-while-write operation is performed in a process of performing a read-modify-write operation, wherein starting time applied to a read operation of the selected bit line pair is at least two read-while-write cycles earlier than starting time applied to a write operation of the selected bit line pair.

14. The operation method according to claim 13, wherein a column-to-column delay is at least two read-while-write cycles.

15. The operation method according to claim 10, further comprising:

cycle lengths of a read operation and a write operation being both equal to two column selection cycles, lengths of time of the first-stage operation and the second-stage operation being both equal to one column selection cycle; and performing error checking and correction on the data of the selected bit line pair by an error-correcting code circuit, wherein wherein starting time applied to the read operation of the selected bit line pair is at least 4 column selection cycles earlier than starting time applied to the write operation of the selected bit line pair a read-modify-write operation is performed on the selected bit line pair.

16. The operation method according to claim 15, wherein a column-to-column delay is at least two column selection cycles.

17. The operation method according to claim 10, wherein lengths of time of the first-stage operation and the second-stage operation are equal.

18. The operation method according to claim 17, wherein the length of time of the first-stage operation in a write operation and the length of time of the first-stage operation in a read operation are equal.

19. A memory device, comprising:

an input/output data latch circuit, coupled between a main input/output line pair and a local input/output line pair; and a bit line sensing amplifier circuit, wherein the local input/output line pair is coupled to a plurality of bit line pairs through the bit line sensing amplifier circuit, wherein the memory device performs a two-stage operation to input or output data of a selected bit line pair among the bit line pairs when the memory device performs a read operation or a write operation, wherein the selected bit line pair connects to the local input/output line pair only during one stage operation of the two-stage operation, and the data of the selected bit line pair latched in the input/output data latch circuit is transmitted to the main input/output line pair during the other stage operation of the two-stage operation, wherein lengths of time of stage operations of the two-stage operation are equal.

20. The memory device according to claim 19, wherein the lengths of time of the two-stage operations in the write operation and in the read operation are equal.

* * * * *